(12) United States Patent
Leeser

(10) Patent No.: US 9,162,209 B2
(45) Date of Patent: Oct. 20, 2015

(54) SEQUENTIAL CASCADING OF REACTION VOLUMES AS A CHEMICAL REUSE STRATEGY

(71) Applicant: Novellus Systems, Inc., San Jose, CA (US)

(72) Inventor: Karl Leeser, Lake Oswego, OR (US)

(73) Assignee: Novellus Systems, Inc., San Jose, CA (US)

( * ) Notice: Subject to any disclaimer, the term of this patent is extended or adjusted under 35 U.S.C. 154(b) by 320 days.

(21) Appl. No.: 13/779,056

(22) Filed: Feb. 27, 2013

(65) Prior Publication Data

US 2013/0228225 A1    Sep. 5, 2013

Related U.S. Application Data

(60) Provisional application No. 61/605,231, filed on Mar. 1, 2012.

(51) Int. Cl.
*B01J 19/00* (2006.01)
*C23C 16/455* (2006.01)

(52) U.S. Cl.
CPC ....... *B01J 19/0006* (2013.01); *C23C 16/45544* (2013.01); *C23C 16/45557* (2013.01); *Y10T 137/0318* (2015.04); *Y10T 137/86389* (2015.04); *Y10T 137/87249* (2015.04)

(58) Field of Classification Search
CPC ................ C23C 16/44; C23C 16/4408; C23C 16/45544; C23C 16/45557; C30B 25/08; C30B 25/14; C30B 25/165; Y10T 137/2521; Y10T 137/2529; Y10T 137/265; Y10T 137/7761; Y10T 137/87249; Y10T 137/86389; Y10T 137/86936

USPC ............ 137/100, 101.19, 118.01, 487.5, 597, 137/624.11, 629; 118/50, 719
See application file for complete search history.

(56) References Cited

U.S. PATENT DOCUMENTS

| | | | | |
|---|---|---|---|---|
| 4,725,204 A | * | 2/1988 | Powell | ........................ 417/205 |
| 5,433,780 A | * | 7/1995 | Ikeda et al. | ..................... 118/50 |
| 7,278,831 B2 | * | 10/2007 | Bailey et al. | .................. 417/248 |
| 8,053,372 B1 | * | 11/2011 | Greer et al. | .................... 438/762 |
| 8,623,457 B2 | * | 1/2014 | Ashizawa | ................ 427/255.28 |

(Continued)

FOREIGN PATENT DOCUMENTS

| | | |
|---|---|---|
| JP | 2001-102281 A | 4/2001 |
| JP | 2002-270663 A | 9/2002 |
| JP | 2011-233707 A | 11/2011 |

OTHER PUBLICATIONS

Written Opinion of the International Search Authority, Jun. 24, 2013; PCT/US2013/028214; 6 pages.

(Continued)

*Primary Examiner* — Matthew W Jellett

(57) ABSTRACT

A substrate processing system includes one or more processing chambers defining N reaction volumes. N-1 first valves are arranged between the N reaction volumes. A controller communicates with the N-1 first valves and is configured to pressurize a first one of the N reaction volumes with precursor gas to a first target pressure, wait a first predetermined soak period, evacuate a second one of the N reaction volumes to a second target pressure that is lower than the first target pressure, and open one of the N-1 first valves between the first one of the N reaction volumes and a second one of the N reaction volumes.

30 Claims, 7 Drawing Sheets

(56) References Cited

U.S. PATENT DOCUMENTS

2002/0066411 A1* 6/2002 Chiang et al. ............... 118/724
2010/0256809 A1 10/2010 Ashizawa
2011/0100554 A1 5/2011 Carlson

OTHER PUBLICATIONS

International Search Report, Jun. 24, 2013; PCT/US2013/028214; 5 pages.

* cited by examiner

SEQUENTIAL CASCADING OF REACTION VOLUMES AS A CHEMICAL REUSE STRATEGY

CROSS-REFERENCE TO RELATED APPLICATIONS

This application claims the benefit of U.S. Provisional Application No. 61/605,231, filed on Mar. 1, 2012. The entire disclosure of the application referenced above is incorporated herein by reference.

FIELD

The present disclosure relates to substrate processing chambers, and more particularly to semiconductor processing chambers.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Some vapor-based reaction technologies and their associated applications, such as dielectric constant (k) recovery and atomic layer deposition (ALD), require expensive precursor gas. These processes involve exposing a substrate to the precursor gas at a target pressure, allowing the substrate to soak and then dumping the precursor gas (an expose/soak/dump sequence). To minimize the use of the precursor gas, significant effort has been expended to minimize reaction volumes, which reduces precursor gas consumption per wafer. However, the smaller reaction volumes may cause other undesirable reactor design compromises, which may increase cost on a per-wafer pass basis.

Referring now to FIG. 1, a first reaction volume 10 is shown. A pedestal 12 is arranged in the first reaction volume 10 and provides support for a substrate 14 such as a semiconductor wafer. Precursor gases 20-1, 20-2, . . . , and 20-N (collectively precursor gases 20) are supplied via valves 22-1, 22-2, . . . , and 22-N (collectively valves 22) to the first reaction volume 10, wherein N is an integer. Purge gas 24 is supplied via a valve 26 to the first reaction volume 10. A pump 30 may be used to selectively draw precursor gas and/or purge gas from the first reaction volume 10.

Referring now to FIG. 2, a method for operating the first reaction volume 10 is shown. At 31, N=1. At 32, the substrate 14 is arranged in the first reaction volume 10 and is exposed to a first precursor gas at a target pressure. At 34, the substrate 14 is allowed to soak in the precursor gas for a predetermined period. At 36, the precursor gas is purged from the first reaction volume 10 and discarded. At 38, if another precursor gas is to be used, control returns to 32. Optionally the sequence may cycle via 39 and 41. Otherwise the process ends.

SUMMARY

A substrate processing system includes one or more processing chambers defining N reaction volumes, wherein N is an integer greater than one. N-b 1 first valves are arranged between the N reaction volumes. A controller is in communication with the N-1 first valves and is configured to pressurize a first one of the N reaction volumes with precursor gas to a first target pressure, wait a first predetermined soak period, evacuate a second one of the N reaction volumes to a second target pressure that is lower than the first target pressure, and open one of the N-1 first valves between the first one of the N reaction volumes and a second one of the N reaction volumes.

In other features, N pressure sensors measure pressure in the N reaction volumes, respectfully. The controller is configured to communicate with the N pressure sensors. N pumps are in fluid communication with the N reaction volumes via N second valves. The controller is configured to selectively operate the N pumps and the N second valves.

In other features, the controller is configured to wait until a predetermined pressure relationship exists between the first one of the N reaction volumes and the second one of the N reaction volumes, and close the one of the N-1 first valves. The predetermined pressure relationship is pressure equilibrium.

In other features, the controller is configured to introduce an additional amount of the precursor gas to the second one of the N reaction volumes to achieve a third target pressure after closing the one of the N-1 first valves.

In other features, the controller is configured to purge residual precursor gas from the first one of the N reaction volumes.

In other features, the controller is configured to wait a second predetermined soak period and cascade the precursor gas in the second one of the N reaction volumes to an additional one of the N reaction volumes.

In still other features, N1 compressors and N-1 second valves are arranged between the N reaction volumes. The controller is further in communication with the N-1 compressors and the N-1 second valves. The controller is configured to, after evacuating the second one of the N reaction volumes to the second target pressure, open one of the N-1 second valves between the first one of the N reaction volumes and the second one of the N reaction volumes, and operate one of the N-1 compressors to drive the precursor gas from the first one of the N reaction volumes to the second one of the N reaction volumes.

In other features, the controller is configured to close the one of the N-1 first valves and the one of the N-1 second valves. The controller is configured to add an additional amount of the precursor gas to the second one of the N reaction volumes to achieve a third target pressure. The controller is configured to purge residual precursor from the first one of the N reaction volumes.

A substrate processing system including a processing chamber defining a reaction volume. A first valve is arranged between the reaction volume and a storage volume. A controller is in communication with the first valve and is configured to pressurize the reaction volume with precursor gas to a first target pressure, wait a predetermined soak period, evacuate the storage volume to a pressure that is lower than the first target pressure and open the first valve.

In other features, the controller communicates with a second valve and a compressor and is configured to operate the first valve, the second valve and the compressor to drive the precursor gas from the reaction volume to the storage volume In other features, a pressure sensor measures pressure in the reaction volume. A pump is in fluid communication with the reaction volume via a second valve. The controller communicates with the pressure sensor, the pump and the second valve. The controller is configured to close the first valve and the second valve. The controller is configured to purge residual precursor from the reaction volume. The controller is configured to open the first valve and the second valve between the reaction volume and the storage volume and operate the compressor to drive the precursor gas from the storage volume to the reaction volume.

In other features, N additional reaction volumes and N additional valves connect the N additional reaction volumes to the compressor. The controller is configured to open one of the first valve or one of the N additional valves, open the second valve, and operate the compressor to pump the precursor gas from the storage volume to one of the reaction volume or one of the N additional reaction volumes.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

According to the present disclosure, a substrate is exposed to a precursor gas in a first reaction volume at a first target pressure. The substrate is allowed to soak in the precursor gas. Then, a valve is opened from the first reaction volume to a second reaction volume (or a storage volume) that is evacuated and at lower pressure than the first target pressure. After equalizing pressure, the valve is closed and precursor gas is added to the second reaction volume to achieve a second target pressure, which may or may not be the same as the first target pressure.

Figure 1:
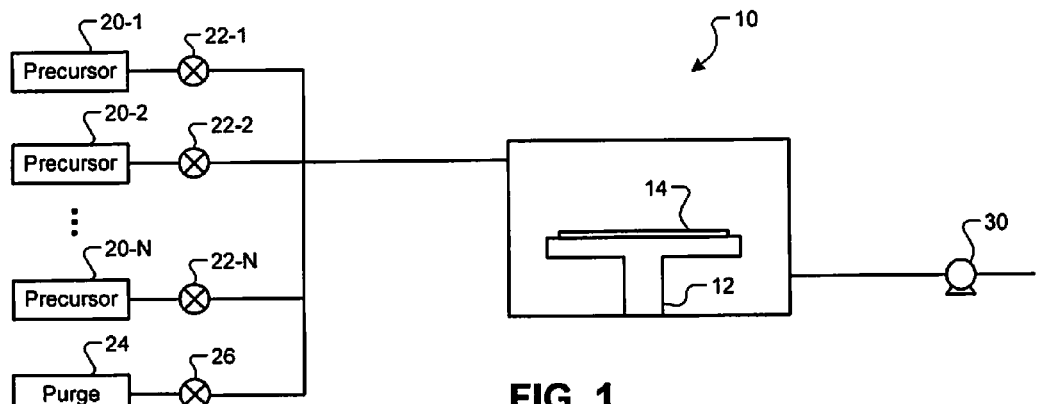
FIG. 1 is a functional block diagram of a first reaction volume according to the prior art.
Figure 2:
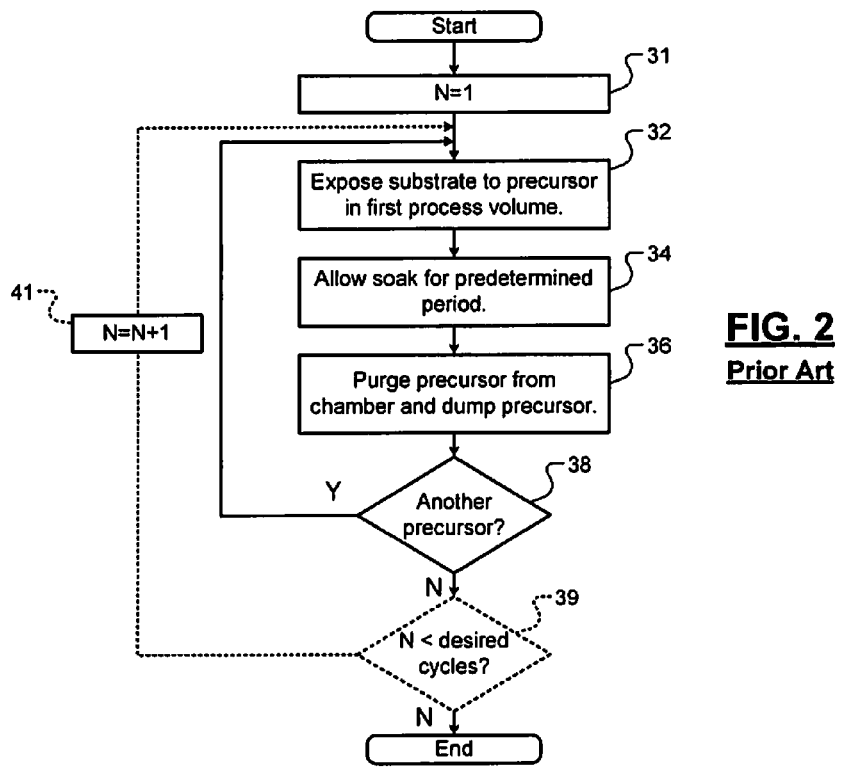
FIG. 2 is a flowchart illustrating operation of the first reaction volume according to the prior art.
Figure 3:
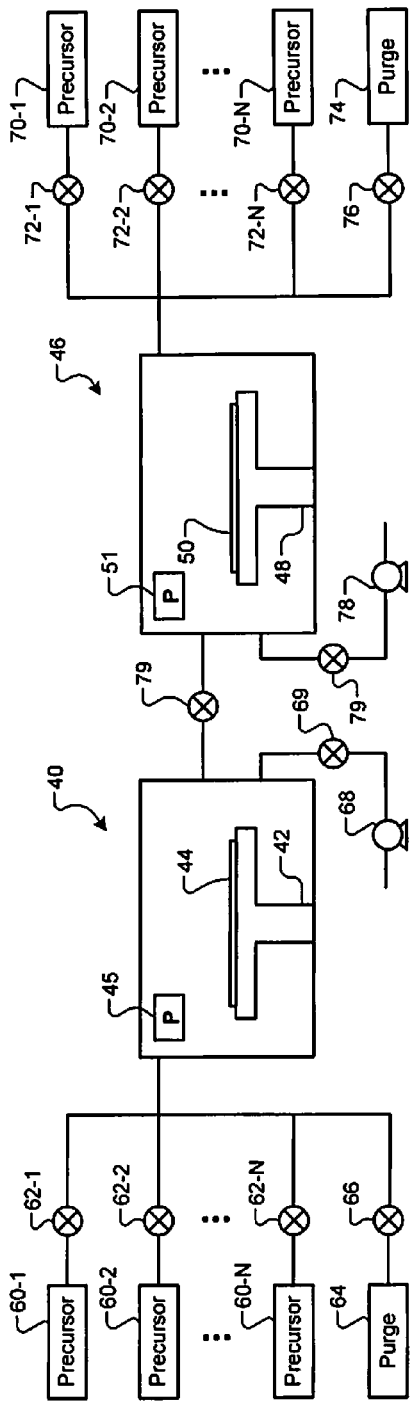
FIG. 3 is a functional block diagram of first and second reaction volumes according to the present disclosure.

Referring now to FIG. 3, a first reaction volume 40 is shown. A pedestal 42 is arranged in the first reaction volume 40 and provides support for a substrate 44 such as a semiconductor wafer. A pressure sensor 45 may be arranged in the first reaction volume 40 to monitor pressure. A second reaction volume 46 is also shown. A pedestal 48 is arranged in the second reaction volume 46 and provides support for a substrate 50 such as a semiconductor wafer. A pressure sensor 51 may be arranged in the second process volume 46 to monitor pressure. Alternately, the pressure sensors 45 and 51 may be omitted and timers may be used to estimate pressure based on timing and/or other parameters.

Precursor gases 60-1, 60-2, . . . , and 60-N (collectively precursor gases 60) are selectively supplied via valves 62-1, 62-2, . . . , and 62-N (collectively valves 62) to the first reaction volume 40. Purge gas 64 is supplied via a valve 66 to the first reaction volume 40. A pump 68 and valve 69 may be used to selectively draw precursor and/or purge gas from the first reaction volume 40.

Precursor gases 70-1, 70-2 and 70-N (collectively precursor gases 70) are selectively supplied via valves 72-1, 72-2, . . . , and 72-N (collectively valves 72) to the second reaction volume 46. Purge gas 74 is selectively supplied via a valve 76 to the second reaction volume 46. A pump 78 and valves 79 may be used to selectively draw precursor and/or purge gas from the second reaction volume 46.

As will be described further below, the substrate 44 is exposed to the precursor gas in the first reaction volume 40. The substrate 44 is allowed to soak in the precursor gas at a first target pressure. Then, a valve 79 is opened between the first reaction volume 40 and the second reaction volume 46. Before opening the valve 79, the second reaction volume 46 is evacuated and maintained at lower pressure than the first reaction volume 40. After equalizing pressure, precursor gas is added to the second reaction volume 46 to achieve a second target pressure, which may or may not be the same as the first target pressure. The substrate 50 is allowed to soak. As can be appreciated, the precursor gas may be purged and dumped or reused in the reaction volume 40.

Figure 4:
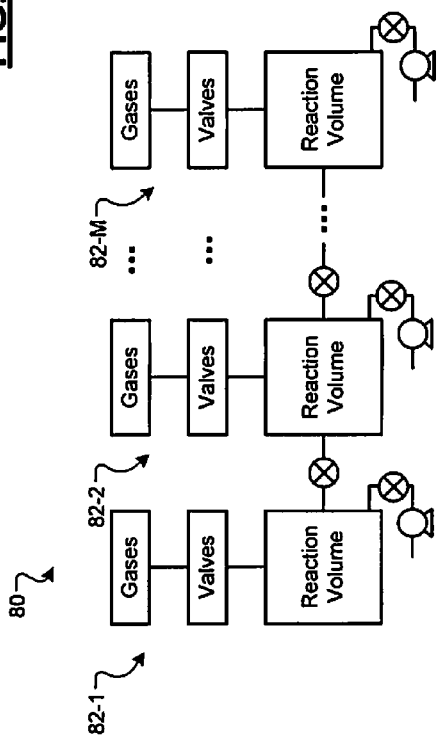
FIG. 4 is a functional block diagram of three or more cascaded reaction volumes according to the present disclosure.

While FIG. 3 shows first and second reaction volumes 40 and 46, three or more cascaded reaction volumes may be used. Referring now to FIG. 4, a system 80 including three or more cascaded reaction volumes 82-1, 82-2 and 82-M is shown where M is an integer greater than two. In addition, while one reaction volume is shown for each processing chamber, each processing chamber may be associated with one or more reaction volumes.

Figure 5:
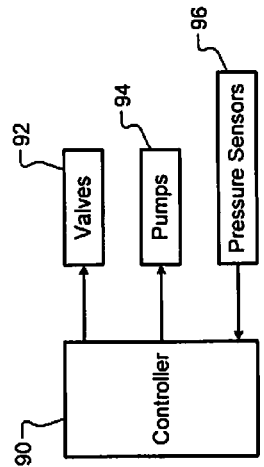
FIG. 5 is a functional block diagram of a controller according to the present disclosure.

Referring now to FIG. 5, a controller 90 that may be used to control a process employing multiple reaction volumes is shown. The controller 90 communicates with and/or controls one or more valves (such as valves 62, 72 and 79, which are collectively identified at 92 in FIG. 5), pumps (such as pumps 68 and 78, which are collectively identified at 94 in FIG. 5) and/or pressure sensors (such as pressure sensors 45 and 51, which are collectively identified at 96 in FIG. 5).

Figure 6:
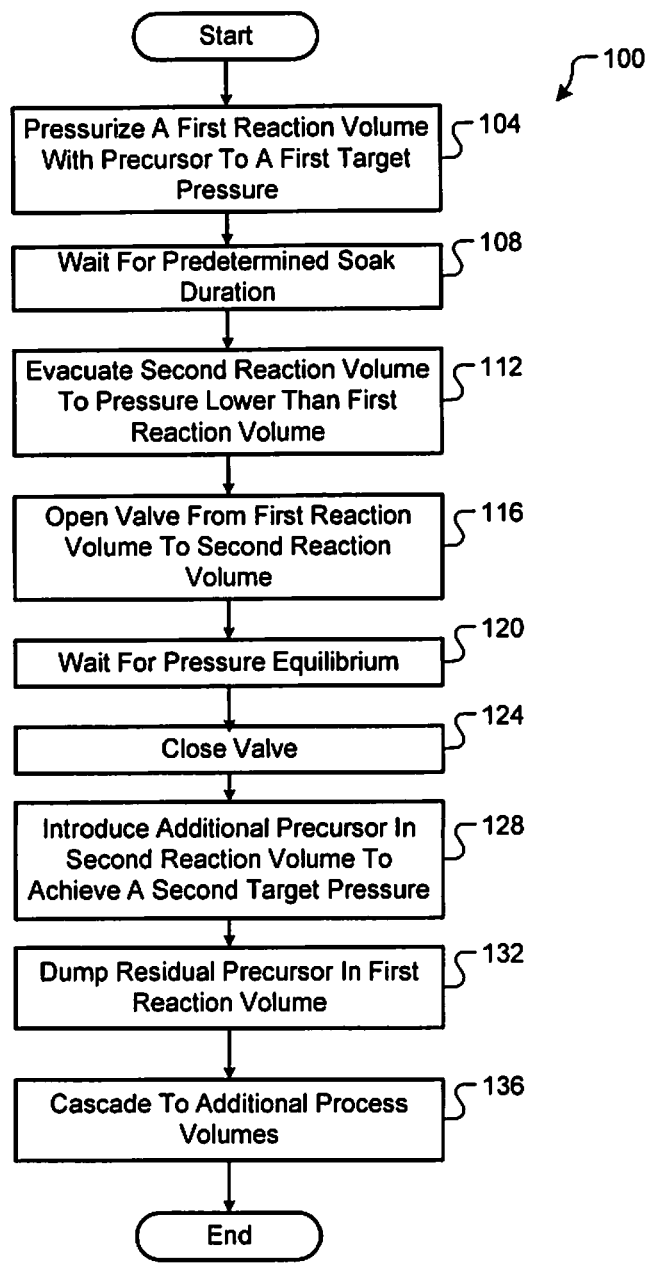
FIG. 6 is a flowchart illustrating a method for operating the first and second reaction volumes of FIG. 3.

Referring now to FIG. 6, an example of a method 100 for operating a controller for the first and second reaction volumes of FIG. 3 is shown. At 104, the first reaction volume is pressurized with a precursor gas to a first target pressure. At 108, the substrate is allowed to soak for a predetermined period. At 112, the second reaction volume is evacuated to a pressure lower than the first reaction volume. At 116, the valve 79 is opened. At 120, a predetermined period is timed to allow pressure equilibrium to occur. As used herein, equilibrium refers to equal or substantially equal pressures. In some examples, substantially equal pressures refer to pressures within 10%, 5%, 2%, 1% or less of each other. The equilibrium pressure will be lower than the target soak pressure in the second reaction volume. If the volumes are equal, then the equilibrium pressure will be approximately half the target pressure assuming that the process volumes are equal.

At 124, the valve 79 is closed. At 128, additional precursor gas is introduced into the second reaction volume to achieve a second target pressure. At 132, residual precursor gas in the first reaction volume may be dumped. A substrate is allowed to soak in the second reaction volume. At 136, the precursor gas in the second reaction volume may be purged and dumped or cascaded to additional reaction volumes if desired.

Figure 7:
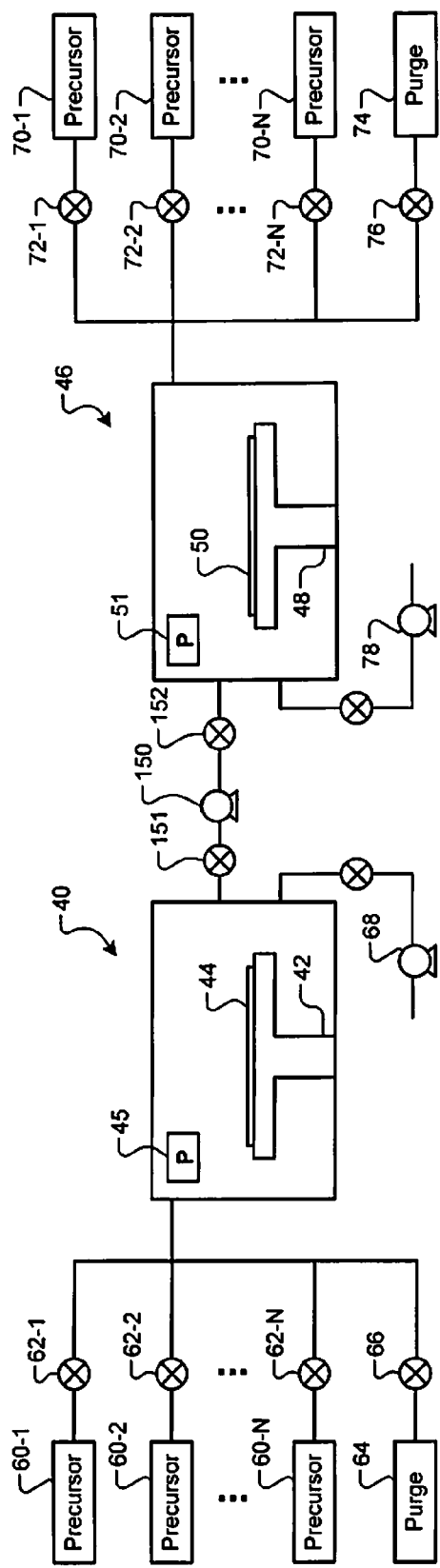
FIG. 7 is a functional block diagram of another arrangement of first and second reaction volumes according to the present disclosure.
Figure 8:
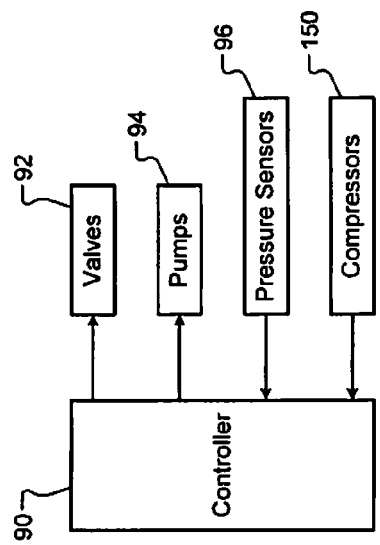
FIG. 8 is a functional block diagram of another controller according to the present disclosure.

Referring now to FIGS. 7-8, another arrangement of first and second reaction volumes is shown. A compressor 150 is arranged between a valve 151 (that is connected to the first reaction volume 40) and the value 152 (that is connected to the second reaction volume 46). In FIG. 8, the controller 90 may be further connected to the compressor 150.

Figure 9:
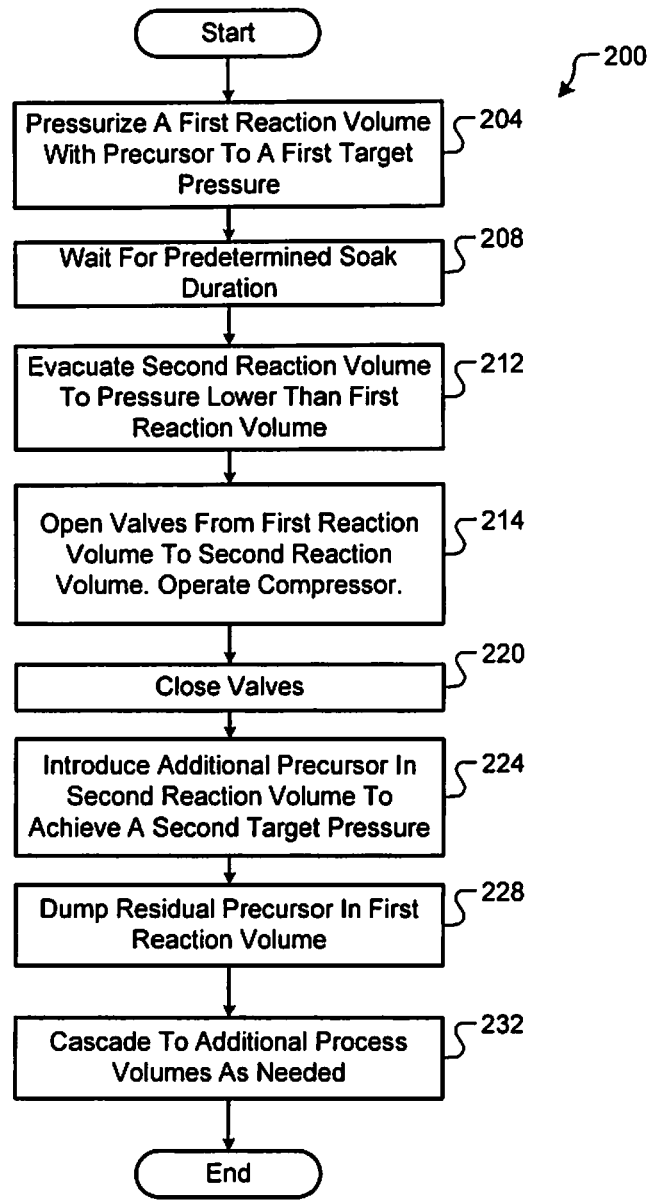
FIG. 9 is a flowchart illustrating a method for operating the first and second reaction volumes of FIG. 7.

Referring now to FIG. 9, an example of a method 200 for operating a controller for the first and second reaction volumes of FIG. 7 is shown. At 204, the first reaction volume is pressurized with a precursor gas to a first target pressure. At 208, the substrate is allowed to soak in the precursor gas for a predetermined period. At 212, the second reaction volume is evacuated to a pressure lower than the first reaction volume. At 216, the valves 151 and 152 are opened to the compressor 150. The compressor 150 compresses the precursor with added energy in order to drive it into the second reaction volume 46.

Pressurization of the second reaction volume will follow a first order exponential response curve. In addition, due to the thermodynamic losses due to compression, the steady state maximum achievable pressure will be lower than the target pressure for the second reaction volume, but higher than the pressure provided by the process described in FIGS. 3 and 6.

At 220, the valves 151 and 152 are closed. At 224, additional precursor gas is introduced into the second reaction volume to achieve a second target pressure. At 228, residual precursor gas in the first reaction volume may be dumped. The substrate in the second reaction volume is allowed to soak. At 232, the precursor gas in the second reaction volume may be cascaded to additional reaction volumes if desired.

Examples of reaction volumes include but are not limited to substrate processing chambers or stations of substrate processing chambers. Examples of processes include, but are not limited to, conformal film deposition, atomic layer deposition, plasma-enhanced atomic layer deposition, and dielectric constant (k) recovery processes. The pedestals may be temperature controlled and/or biased by an RF bias. While the processes described above include a soak step, additional operations may be performed.

Figure 10:
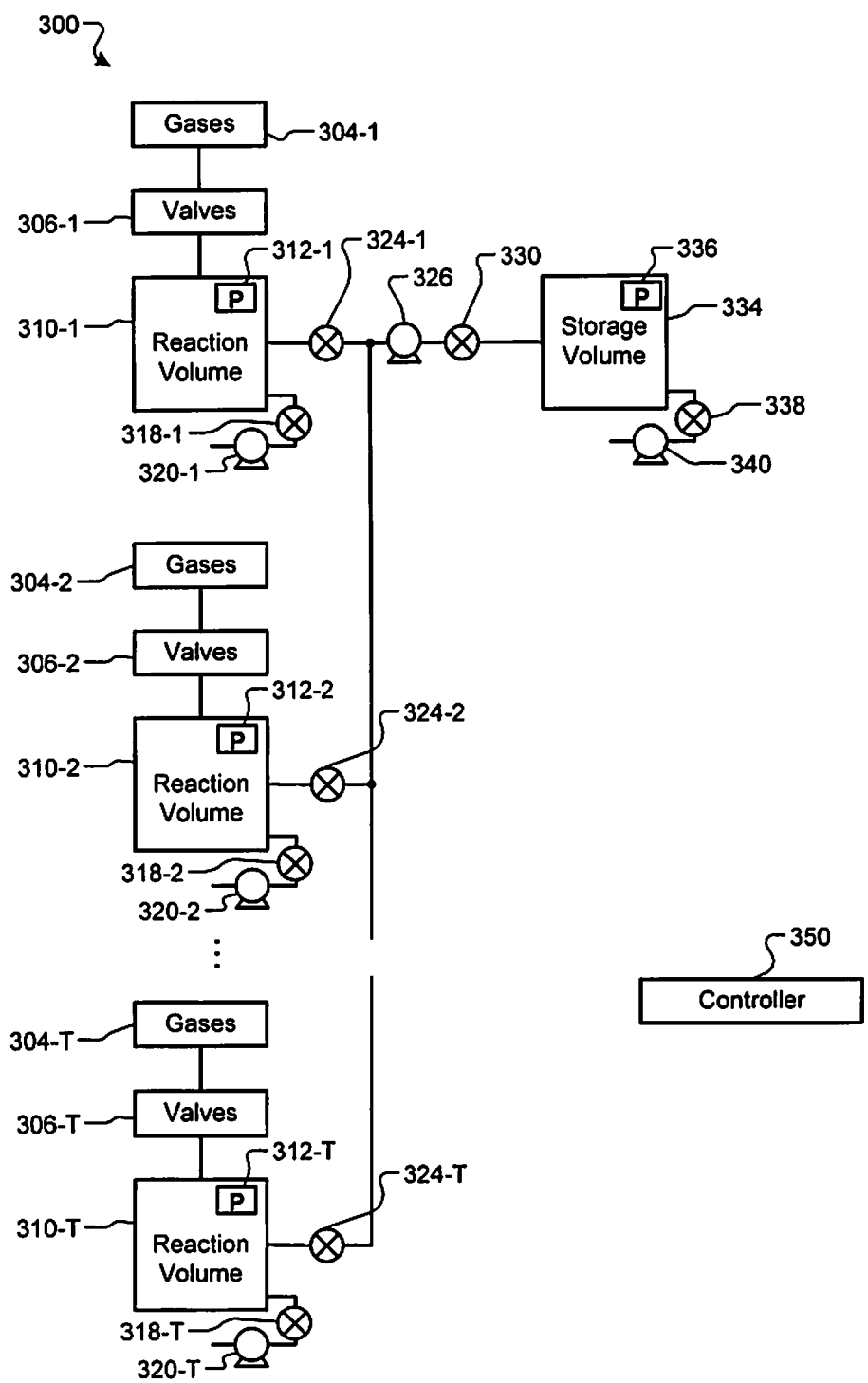
FIG. 10 is a functional block diagram of another arrangement of reaction volumes according to the present disclosure.

Referring now to FIG. 10, another substrate processing system 300 is shown. Process gases 304-1, 304-2, . . . , and 304-T are selectively supplied to reaction volumes 310-1, 310-2, . . . , and 310-T via valves 306-1, 306-2, . . . , and 306T, respectively. Pressure sensors 312-1 312-2, . . . , and 312-T monitor pressure in the reaction volumes 310-1, 310-2, . . . , 310-T, respectively. The reaction volumes 310-1, 310-2, . . . , and 310-T can be evacuated using valves 318-1, 318-2, . . . , and 318-T and pumps 320-1, 320-2, . . . , and 320-T, respectively. Valves 324-1, 324-2, . . . , and 324-T, a compressor 326 and a second valve 330 are connected between the reaction volumes 310-1, 310-2, . . . , and 310-T, respectively, and a storage volume 334. The storage volume 334 can be evacuated using a valve 338 and a pump 340.

A controller 350 communicates with the pressure sensors 312 and 336, the pumps 320 and 340, the valves 318, 324, 330 and 338 and the compressor 326. The controller 350 pressurizes the reaction volume of the reaction volume 310-1 with precursor to a first target pressure. The controller 350 waits a predetermined soak period. The controller 350 evacuates the storage volume 334 to a pressure that is lower than the first target pressure. The controller 350 opens the valves 324-1 and 330 between the reaction volume 310-1 and the storage volume 334. The controller 350 operates the compressor 326 to pump the precursor gas from the reaction volume 310-1 to the storage volume 334.

The controller 350 closes the valves 324-1 and 330. The controller 350 may purge residual precursor from the first reaction volume. The controller 350 may open any one of the valves 324-1, 324-2, . . . , and 324-T and the valve 330 between one of the reaction volumes 310-1, 310-2, . . . , and 310-T and the storage volume 334 and operates the compressor 326 to pump the precursor from the storage volume 334 back to the one of the reaction volumes 310-1, 310-2, . . . , and 310-T. Additional precursor gas may be added to the selected reaction volume as described above.

As can be appreciated, T processing chambers can be connected to S storage volumes, where T and S are integers and T>=S. For example in FIG. 10, T processing chambers may be connected to 1 storage volume that is shared. The precursor gas can be returned to the same processing chamber or a different processing chamber.

Figure 11:
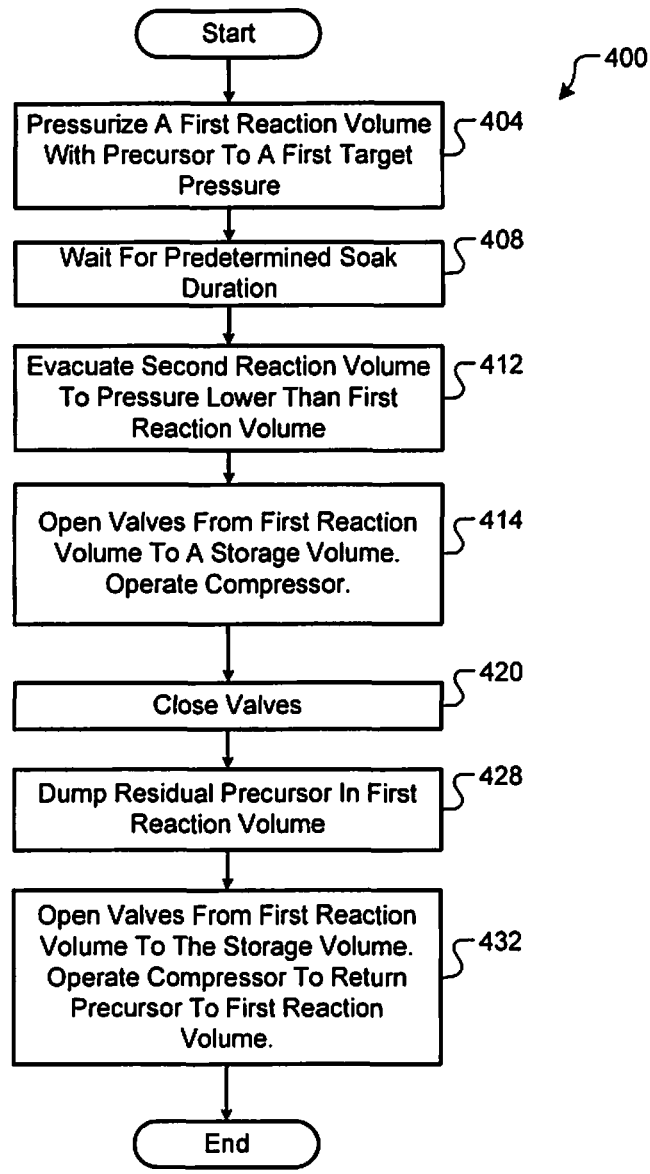
FIG. 11 is a flowchart illustrating a method for operating the reaction volumes of FIG. 10.

Referring now to FIG. 11, an example of a method 400 for operating the reaction volumes and storage volume of FIG. 10 is shown. At 404, the first reaction volume is pressurized with a precursor gas to a first target pressure. At 408, the substrate is allowed to soak in the precursor gas for a predetermined period. At 412, the storage volume is evacuated to a pressure lower than the first reaction volume. At 416, the valves are opened and the compressor is operated. The compressor compresses the precursor with added energy in order to drive it into the storage volume.

At 420, controller closes the valves. At 428, residual precursor gas in the first reaction volume may be dumped. One or more operations may be performed in the first reaction volume. At 432, the valves are opened from the storage volume to the first reaction volume or any of the other reaction volumes and the compressor is operated to deliver the precursor gas to the selected reaction volume.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term controller may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term controller may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple controllers may be executed using a single (shared) processor. In addition, some or all code from multiple controllers may be stored by a single (shared) memory. The term group, as used above, means that some or all code from a single controller may be executed using a group of processors. In addition, some or all code from a single controller may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

What is claimed is:

1. A substrate processing system comprising:
   N processing chambers defining N reaction volumes, wherein N is an integer greater than one;
   N-1 first valves arranged between the N reaction volumes, wherein a reaction volume refers to a volume in which a substrate is exposed to a precursor gas;
   a controller in communication with the N-1 first valves and configured to:
      pressurize a first one of the N reaction volumes with the precursor gas to a first target pressure;
      wait a first predetermined soak period;
      evacuate a second one of the N reaction volumes to a second target pressure that is lower than the first target pressure;
      open one of the N-1 first valves between the first one of the N reaction volumes and the second one of the N reaction volumes;
      close the one of the N-1 first valves subsequent to the opening of the one of the N-1 first valves; and
      introduce an additional amount of the precursor gas to the second one of the N reaction volumes to achieve a third target pressure after the closing of the one of the N-1 first valves; and
   N-1 compressors and N-1 second valves arranged between the N reaction volumes, wherein:
      the controller is further in communication with the N-1 compressors and the N-1 second valves; and
      the controller is configured to:
         after evacuating the second one of the N reaction volumes to the second target pressure, open one of the N-1 second valves between the first one of the N reaction volumes and the second one of the N reaction volumes; and
         operate one of the N-1 compressors to drive the precursor gas from the first one of the N reaction volumes via one of the N-1 first valves to the second one of the N reaction volumes via one of the N-1 second valves.

2. The substrate processing system of claim 1, further comprising N pressure sensors that measure pressure in the N reaction volumes, respectively, wherein the controller is configured to communicate with the N pressure sensors.

3. The substrate processing system of claim 1, further comprising N pumps in fluid communication with the N reaction volumes via N second valves, wherein the controller is configured to selectively operate the N pumps and the N second valves.

4. The substrate processing system of claim 1, wherein the controller is configured to:
   wait until a predetermined pressure relationship exists between the first one of the N reaction volumes and the second one of the N reaction volumes; and
   perform the closing of the one of the N-1 first valves in response to the predetermined pressure relationship existing between the first one of the N reaction volumes and the second one of the N reaction volumes.

5. The substrate processing system of claim 4, wherein the predetermined pressure relationship is pressure equilibrium.

6. The substrate processing system of claim 4, wherein the controller is configured to purge a residual precursor gas from the first one of the N reaction volumes.

7. The substrate processing system of claim 1, wherein the controller is configured to:
   wait a second predetermined soak period; and
   cascade the precursor gas in the second one of the N reaction volumes to an additional one of the N reaction volumes.

8. The substrate processing system of claim 1, wherein the controller is configured to close the one of the N-1 first valves and the one of the N-1 second valves.

9. The substrate processing system of claim 8, wherein the controller is configured to add an additional amount of the precursor gas to the second one of the N reaction volumes to achieve the third target pressure.

10. The substrate processing system of claim 8, wherein the controller is configured to purge a residual precursor from the first one of the N reaction volumes.

11. A substrate processing system comprising:
    a processing chamber defining a reaction volume;
    a first valve arranged between the reaction volume and a storage volume, wherein the storage volume is void of a reaction volume, and wherein a reaction volume refers to a volume in which a substrate is exposed to a precursor gas;
    a controller in communication with the first valve and configured to:
       pressurize the reaction volume with the precursor gas to a first target pressure;
       wait a predetermined soak period;
       evacuate the storage volume to a pressure that is lower than the first target pressure; and
       open the first valve;
    a second valve arranged between the first valve and the storage volume; and
    a compressor arranged between the first valve and the second valve,
    wherein the controller communicates with the second valve and the compressor and is configured to: subsequent to opening the first valve, operate the first valve, the second valve and the compressor to drive the precursor gas from the reaction volume of the processing chamber to the storage volume, and subsequent to driving the precursor gas from the reaction volume of the processing chamber to the storage volume, pump the precursor gas back from the storage volume through the compressor to the reaction volume.

12. The substrate processing system of claim 11, further comprising:
    a pressure sensor that measures pressure in the reaction volume of the processing chamber; and
    a pump in fluid communication with the reaction volume via a third valve,
    wherein the controller communicates with the pressure sensor, the pump and the third valve.

13. The substrate processing system of claim 11, wherein the controller is configured to close the first valve and the second valve.

14. The substrate processing system of claim 11, wherein the controller is configured to purge a residual precursor gas from the reaction volume of the processing chamber.

15. The substrate processing system of claim 14, wherein the controller is configured to:
open the first valve and the second valve between the reaction volume and the storage volume; and
operate the compressor to drive the precursor gas from the storage volume to the reaction volume.

16. The substrate processing system of claim 11, further comprising:
N additional reaction volumes;
N additional valves connecting the N additional reaction volumes to the compressor,
wherein the controller is configured to:
open one of the first valve or one of the N additional valves;
open the second valve; and
operate the compressor to pump the precursor gas from the storage volume to one of the reaction volume or one of the N additional reaction volumes.

17. A method comprising:
pressurizing a first one of N reaction volumes with a precursor gas to a first target pressure, wherein a reaction volume refers to a volume in which a substrate is exposed to a precursor gas;
waiting a first predetermined soak period;
evacuating a second one of the N reaction volumes to a second target pressure that is lower than the first target pressure;
opening one of N-1 first valves between the first one of the N reaction volumes and the second one of the N reaction volumes;
after evacuating the second one of the N reaction volumes to the second target, opening one of N-1 second valves between the first one of the N reaction volumes and the second one of the N reaction volumes; and
operating one of N-1 compressors between the N reaction volumes to drive the precursor gas from the first one of the N reaction volumes via one of the N-1 first valves to the second one of the N reaction volumes via one of the N-1 second valves.

18. The method of claim 17, further comprising:
waiting until a predetermined pressure relationship occurs between the first one of the N reaction volumes and the second one of the N reaction volumes; and
closing the first one of the N-1 first valves.

19. The method of claim 18, wherein the predetermined pressure relationship is pressure equilibrium.

20. The method of claim 18, further comprising introducing an additional amount of the precursor gas to the second one of the N reaction volumes to achieve a third target pressure after closing the first one of the N-1 first valves.

21. The method of claim 18, further comprising purging a residual precursor gas from the first reaction volume.

22. The method of claim 20, further comprising:
waiting a second predetermined soak period; and
cascading the precursor gas to an additional one of the N reaction volumes.

23. The method of claim 17, further comprising closing the one of the N-1 first valves and the one of the N-1 second valves.

24. The method of claim 23, further comprising adding an additional amount of the precursor gas to the second one of the N reaction volumes to achieve a third target pressure.

25. The method of claim 23, further comprising purging a residual precursor gas from the first one of the N reaction volumes.

26. A method of operating a substrate processing system comprising:
pressurizing a reaction volume in a processing chamber with a precursor gas to a first target pressure;
waiting a predetermined soak period;
evacuating a storage volume to a pressure that is lower than the first target pressure, wherein the storage volume is void of a reaction volume, and wherein a reaction volume refers to a volume in which a substrate is exposed to the precursor gas;
opening a first valve located between the reaction volume of the processing chamber and the storage volume;
opening a second valve between the first valve and the storage volume; and
operating a compressor between the first valve and the storage volume to: drive the precursor gas from the reaction volume of the processing chamber to the storage volume, and subsequent to driving the precursor gas from the reaction volume of the processing chamber to the storage volume, pump the precursor gas back from the storage volume through the compressor to the reaction volume.

27. The method of claim 26, further comprising closing the first valve and the second valve.

28. The method of claim 26, further comprising purging a residual precursor gas from the reaction volume of the processing chamber.

29. The method of claim 26, further comprising:
opening the first valve and the second valve between the reaction volume of the processing chamber and the storage volume; and
operating the compressor to drive the precursor gas from the storage volume to the reaction volume of the processing chamber.

30. The method of claim 26, further comprising:
opening the first valve or one of N additional valves, wherein the N additional valves connect N additional reaction volumes to the compressor;
opening the second valve; and
operating the compressor to pump the precursor gas from the storage volume to the reaction volume of the processing chamber or one of the N additional reaction volumes.

* * * * *